US010855242B1

(12) United States Patent
Kan et al.

(10) Patent No.: US 10,855,242 B1
(45) Date of Patent: Dec. 1, 2020

(54) ADAPTIVE EQUALIZER FOR HIGH SPEED SERIAL DATA AND RELATED CONTROL METHOD

(71) Applicant: Rafael Microelectronics, Inc., Hsinchu County (TW)

(72) Inventors: Meng-Ping Kan, Hsinchu County (TW); Hao-Yun Tang, Taipei (TW); Chia-Kai Chang, Hsinchu County (TW)

(73) Assignee: Rafael Microelectronics, Inc., Hsinchu County (TW)

( * ) Notice: Subject to any disclaimer, the term of this patent is extended or adjusted under 35 U.S.C. 154(b) by 0 days.

(21) Appl. No.: 16/509,506

(22) Filed: Jul. 12, 2019

(51) Int. Cl.

| | |
|---|---|
| ***H04L 27/06*** | (2006.01) |
| ***H03G 5/16*** | (2006.01) |
| ***H03G 5/00*** | (2006.01) |
| ***H04R 1/22*** | (2006.01) |
| ***H03G 5/24*** | (2006.01) |

(52) U.S. Cl.
CPC ............. *H03G 5/165* (2013.01); *H03G 5/005* (2013.01); *H03G 5/24* (2013.01); *H04R 1/22* (2013.01); *H03G 2201/103* (2013.01); *H03G 2201/208* (2013.01)

(58) Field of Classification Search
CPC .......... H03G 5/165; H03G 5/005; H03G 5/24; H03G 2201/103; H03G 2201/208; H04R 1/22; H04B 7/18513; H04B 1/30
USPC ........ 375/345, 346, 350, 229, 230, 232, 233
See application file for complete search history.

(56) References Cited

U.S. PATENT DOCUMENTS

2003/0161424 A1* 8/2003 Varela ................ H04B 7/18513 375/350
2005/0070325 A1* 3/2005 Bellaouar ................ H04B 1/30 455/550.1

* cited by examiner

*Primary Examiner* — Phuong Phu
(74) *Attorney, Agent, or Firm* — Winston Hsu

(57) ABSTRACT

An equalizer system includes at least one equalizer configured to equalize an input signal to generate an equalized input signal; a limiting amplifier coupled to the at least one equalizer, and configured to amplify the equalized input signal to a saturated level to generate an output signal; and a control circuit coupled to the at least one equalizer and the limiting amplifier, and configured to generate at least one control signal to the at least one equalizer according to the equalized input signal to adjust a peak gain of the at least one equalizer, wherein the peak gain of the at least one equalizer is at a Nyquist frequency.

19 Claims, 4 Drawing Sheets

1
101
102
103
104
Din
Deq
Dout
CT1
CT2
CT3
100
115
113
111
105
108
110
116
114
112
106
107
/N

ADAPTIVE EQUALIZER FOR HIGH SPEED SERIAL DATA AND RELATED CONTROL METHOD

BACKGROUND OF THE INVENTION

1. Field of the Invention

The present invention relates to an adaptive equalizer for high speed serial data and related control method, and more particularly, to an adaptive equalizer system for high speed serial data and related control method.

2. Description of the Prior Art

High speed communication links are commonly utilized in the telecommunication, data communication, networking and electronic industries. Modern communication systems, such as voice, data, video, and other communication devices rely on high speed data communication to exchange data between remote locations or between elements network or communication system.

Adaptive equalizers are used to restore signal integrity by compensating for the frequency dependent attenuation that occurs during transmission of serial data over the physical cable. However, circuitry for performing the attenuation estimation needed for adaptive equalization has been complex and difficult to implement.

Therefore, how to simplify the circuitry for performing the attenuation estimation needed for adaptive equalization is a topic in the industry.

SUMMARY OF THE INVENTION

It is therefore an objective of the present invention to provide an adaptive equalizer system for high speed serial data and related method.

The present invention discloses an equalizer system including at least one equalizer configured to equalize an input signal to generate an equalized input signal; a limiting amplifier coupled to the at least one equalizer, and configured to amplify the equalized input signal to a saturated level to generate an output signal; and a control circuit coupled to the at least one equalizer and the limiting amplifier, and configured to generate at least one control signal to the at least one equalizer according to the equalized input signal to adjust a peak gain of the at least one equalizer, wherein the peak gain of the at least one equalizer is at a Nyquist frequency.

The present invention further discloses a control method of adjusting a peak gain of an equalizer of an equalizer system. The method includes down converting an input signal to a first down-converted signal with a first conversion frequency, wherein the first conversion frequency at a Nyquist frequency; down converting the input signal to a second down-converted signal with a second conversion frequency, wherein the second conversion frequency is a lower frequency. (i.e., ⅛ to 1/16 Nyquist frequency); comparing the first down-converted signal with the second down-converted signal to generate a control signal; and adjusting the peak gain of the equalizer according to the control signal, wherein the peak gain of the equalizer is at a Nyquist frequency.

The equalizer system of the present invention extracts two signal components at the Nyquist frequency and a lower frequency, by comparing the first and second signal components, the control circuit is able to adjust the peak gains of the equalizer in order to keep the DC power difference at the predetermined magnitude and adapt to practical requirements.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
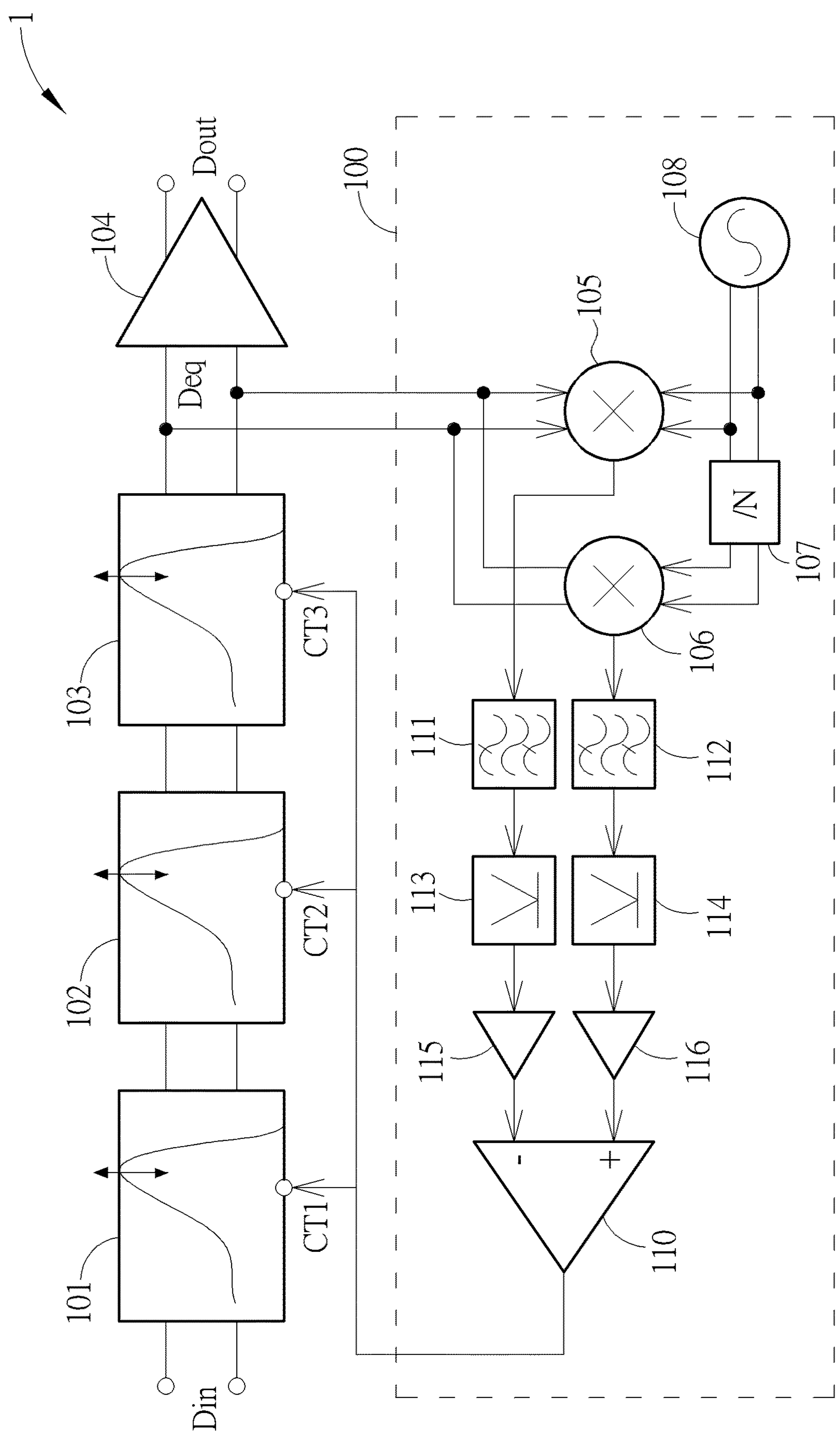
FIG. 1 is a schematic diagram of an equalizer system according to an embodiment of the present invention.

FIG. 1 is a schematic diagram of an equalizer system 1 according to an embodiment of the present invention. The equalizer system 1 includes a control circuit 100, a first equalizer 101, a second equalizer 102, a third equalizer 103, and a limiting amplifier 104.

The first equalizer 101, the second equalizer 102, and the third equalizer 103 are serially connected together, and configured to equalize a pair of input signals Din to generate a pair of equalized input signals Deq according to a first control signal CT1, a second control signal CT2 and a third control signal CT3, respectively. In one embodiment, the input signals Din include a data signal, which are linear NRZ (non-return to zero) random serial data signals.

The first, second and third equalizers 101, 102, and 103 may be an analog filter amplifier in which at least one of an operating frequency, a frequency bandwidth, a peak gain and a DC (direct current) level gain is adjustable.

Figure 2:
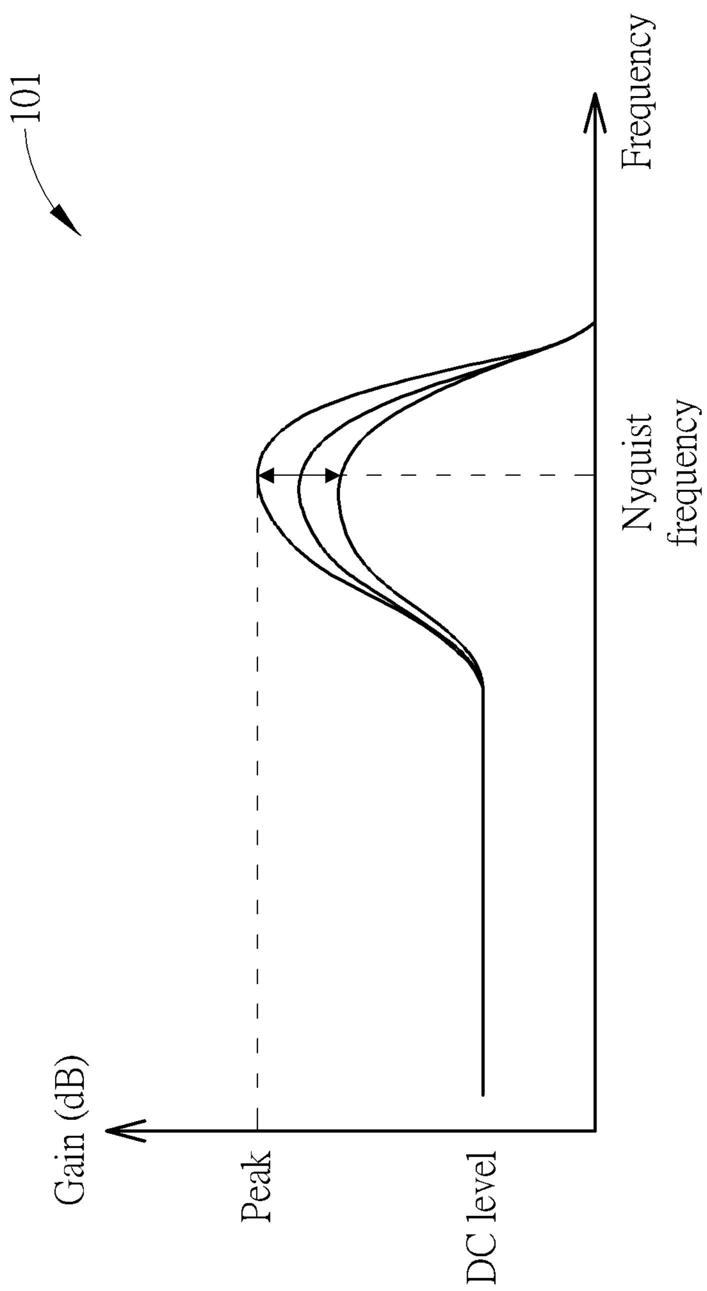
FIG. 2 is a gain-frequency response diagram of the first equalizer according to an embodiment of the present invention.

FIG. 2 is a gain-frequency response diagram of the first equalizer 101 according to an embodiment of the present invention. The peak gain of the first equalizer 101 is at a Nyquist frequency. Note that the peak gain of the second and third equalizers 102 and 103 is at the same Nyquist frequency. For example, the first, second and third equalizers 101, 102, and 103 may have a peak gain of 10 dB at 10 GHz (i.e., Nyquist frequency) and a DC level gain of 5 dB. Note that the peak gain and the DC level gain are adjustable by either analog or digital control of the control circuit 100. Given that a total peak gain adjustment range is 18 dB, a peak gain adjustment range of each the first, second and third equalizers 101, 102, and 103 is 6 dB, which is not limited.

Referring to FIG. 1, the limiting amplifier 104 is coupled to the third equalizer 103 and the control circuit 100, and configured to amplify the equalized input signals Deq to a saturated level to generate a pair of output signals Dout for the following CDR (clock and data recovery) or de-serial system to recover data.

The control circuit 100 includes a first mixer 105, a second mixer 106, a frequency divider 107, an oscillator 108, a first filter 111, a second filter 112, a first rectifier 113, a second rectifier 114, a first direct amplifier 115, a second direct amplifier 116, and a comparator 110. The control circuit 100 is coupled to the limiting amplifier 104 and the third equalizer 103, and configured to generate the first control signal CT1, the second control signal CT2, and the third control signal CT3 according to the equalized input signals Deq.

The oscillator 108 is coupled to the first mixer 105 and the frequency divider 107, and configured to generate a first conversion frequency. The first conversion frequency generated by the oscillator 108 may be chosen from frequencies around the Nyquist frequency. For example, given that a system data rate Rb=25 Gigabit/second, the first conversion frequency may be around 12.5 GHz.

The first mixer 105 is coupled to the oscillator 108 and the third equalizer 103, and configured to down-covert the equalized input signals Deq with the first conversion frequency corresponding to the first filter 111 to generate a first down-converted signal. For example, given that a data rate of the equalized input signal Deq is 25 Gigabit/second and the Nyquist frequency of the equalized input signal Deq is 12.5 GHz, the first mixer 105 may down-convert the equalized input signal Deq to a frequency around but not equal to 12.5 GHz.

The first filter 111 is a band pass filter coupled to the first mixer 105 and the first rectifier 113, and configured to filter the first down-converted signal within a frequency range (e.g., 100-200 MHz bandwidth).

The first rectifier 113 is coupled to the first filter 111 and the first direct amplifier 115, and configured to extract the power of the first down-converted signal of a small frequency range and covert it to DC level. Note that the first rectifier 113 is also called a RMS (root mean square) detector.

The first direct amplifier 115 is coupled to the first rectifier 113 and the comparator 110, and configured to amplify the first down-converted signal with a first DC gain to generate a first amplified signal. In one embodiment, the first DC gain is 1.4.

The frequency divider 107 is coupled to the oscillator 108 and the second mixer 106, and configured to divide the first conversion frequency by a number (e.g., 4) to generate a second conversion frequency. In other words, the second conversion frequency is one quarter of the first conversion frequency. For example, the system frequency is 25 GHz=Tb, the first conversion frequency is 12.5 GHz=½Tb, and the second conversion frequency is 3.125 GHz=⅛Tb.

The second mixer 106 is coupled to the frequency divider 107 and the second filter 112, and configured to down-covert the equalized input signals Deq with the second conversion frequency corresponding to the second filter 112 to generate a second down-converted signal.

The second filter 112 is a band pass filter coupled to the second mixer 106 and the second rectifier 114, and configured to filter the second down-converted signal within a frequency range (e.g., 100-200 MHz bandwidth).

The second rectifier 114 is coupled to the second filter 112 and the second 116, and configured to extract the power of the second down-converted signal of a small frequency range and covert it to DC level. Note that the second rectifier 114 is also called a RMS (root mean square) detector.

The second direct amplifier 116 is coupled to the second rectifier 114 and the comparator 110, and configured to amplify the second down-converted signal with a second DC gain to generate a second amplified signal. In one embodiment, the second DC gain is 1.4.

The comparator 110 includes a negative input terminal coupled to the first direct amplifier 115, a positive input terminal coupled to the second direct amplifier 116, and an output terminal coupled to the first, second and third equalizers 101, 102, and 103. The comparator 110 is configured to compare the first amplified signal with the second amplified signal to generate the first, second, and third control signals CT1, CT2, and CT3.

Under the circuit structure of the equalizer system 1, the control circuit 100 may be regarded as a control loop to extract first and second signal components from the equalized input signals Deq, by comparing the first and second signal components, the first, second, and third control signals CT1, CT2, and CT3 may be generated to adjust the peak gains of the first, second and third equalizers 101, 102, and 103, so as to adapt to practical requirements.

Figure 3:
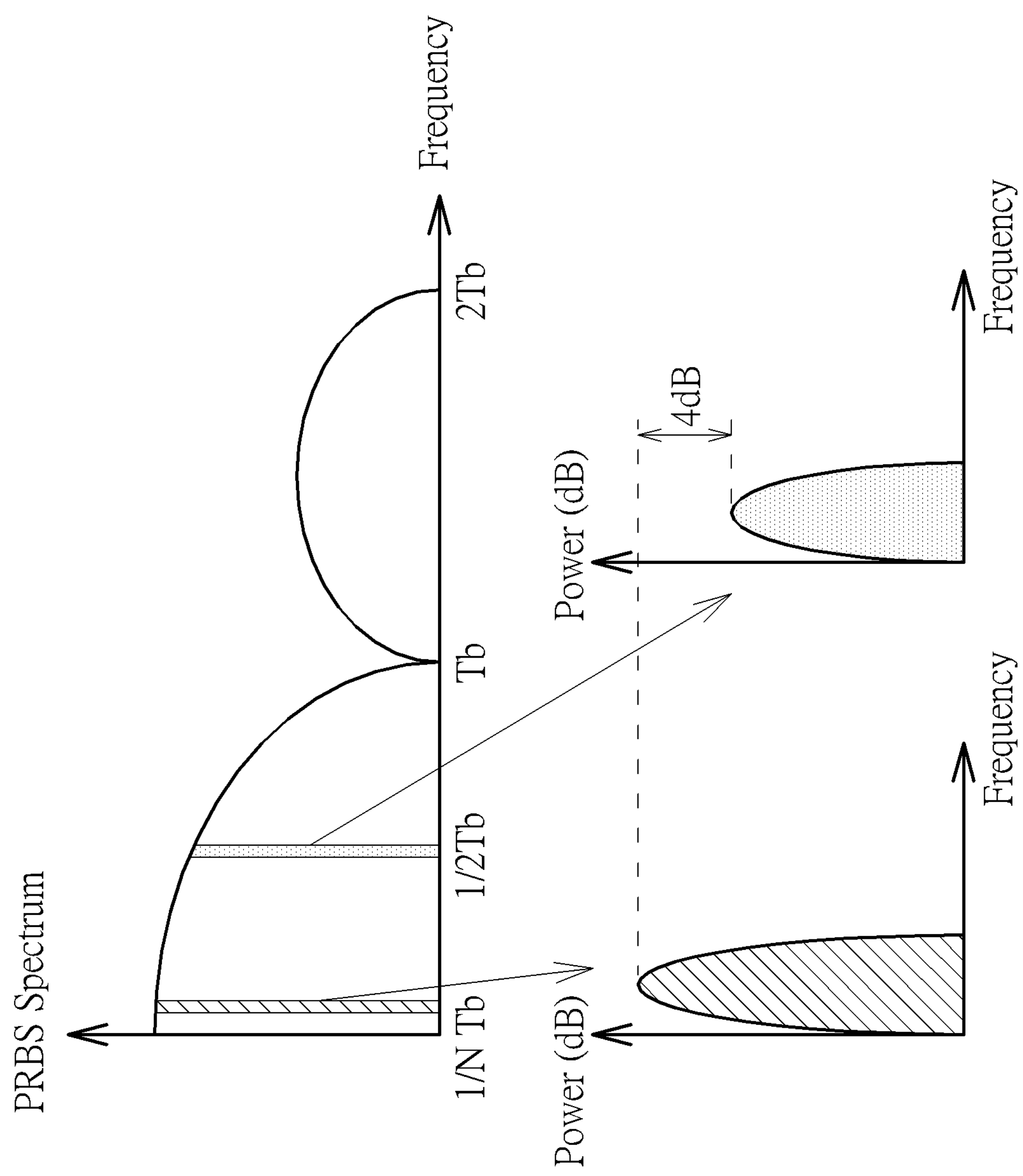
FIG. 3 is a pseudorandom binary sequence (PRBS) spectrum of the equalized input signals according to an embodiment of the present invention.

FIG. 3 is a pseudorandom binary sequence (PRBS) spectrum of the equalized input signals Deq according to an embodiment of the present invention. A first down-converted signal ½Tb and a second down-converted signal ⅛Tb of the equalized input signals Deq are extracted to be compared by the comparator 110, wherein Tb is the system frequency of equalizer system with 25 GHz.

In this embodiment, a goal is to keep a DC power difference between the first down-converted signal ½Tb and the second down-converted signal ⅛Tb by a predetermined magnitude, e.g., 4 dB. When the power of the first down-converted signal ½Tb is too small, the DC power difference will larger than the predetermined magnitude. Therefore, the comparator 110 may generate the first, second, and third control signals CT1, CT2 and CT3 to adjust the peak gain of the first, second, and third equalizers 101, 102, and 103, thereby increase the DC power of first down-converted signal ½Tb in order to keep the DC power difference at the predetermined magnitude.

Note that after the DC level of the first down-converted signal ½Tb (or the first amplified signal) has been compared with the second down-converted signal ⅛Tb (or the second amplified signal), a feedback polarity must be negative, so that the DC power difference converges to the predetermined magnitude.

Figure 4:
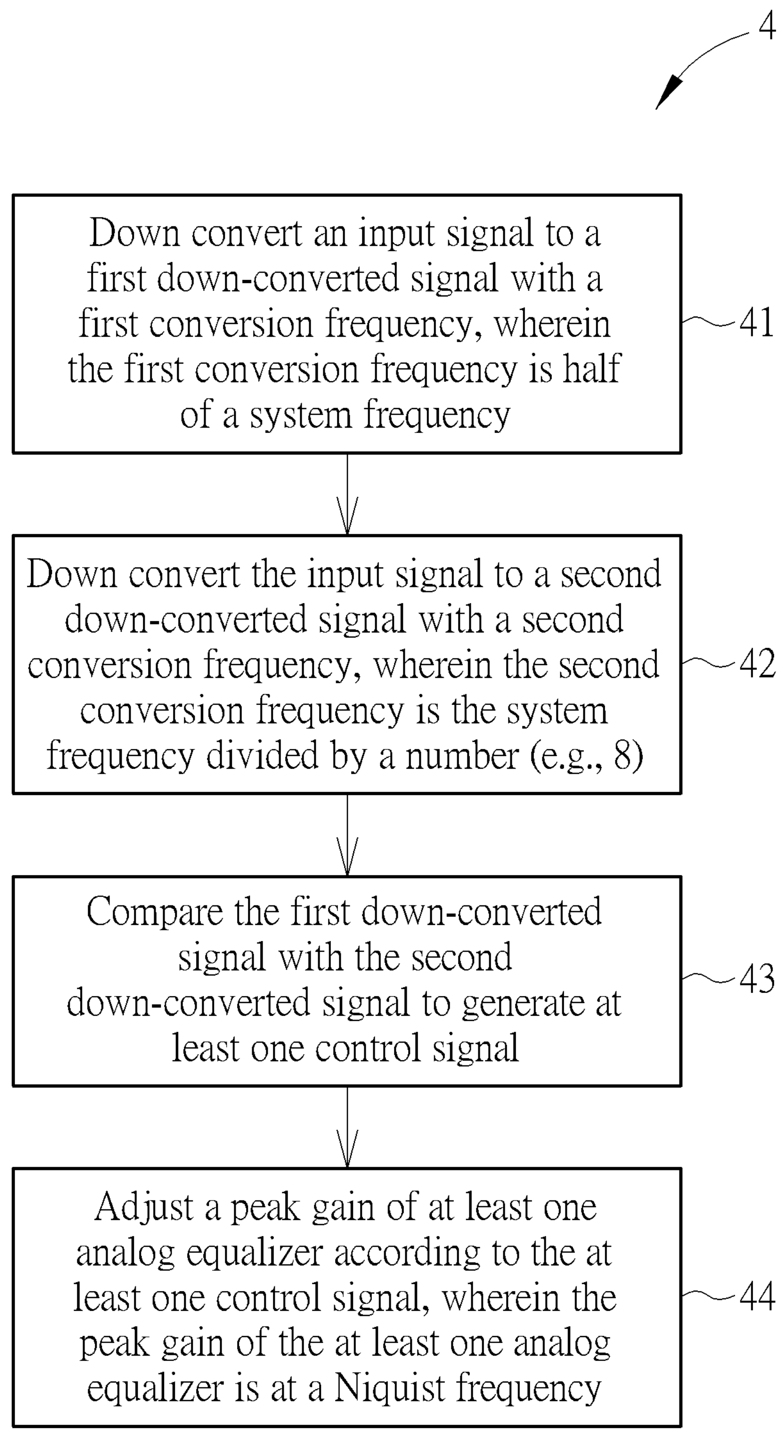
FIG. 4 is a flowchart of a control process according to an embodiment of the present invention.

Operations of the equalizer system 1 may be summarized into a control process 4, as shown in FIG. 4, the control process includes the following steps.

Step 41: Down convert an input signal to a first down-converted signal with a first conversion frequency, wherein the first conversion frequency is half of a system frequency.

Step 42: Down convert the input signal to a second down-converted signal with a second conversion frequency, wherein the second conversion frequency is the system frequency divided by a number (e.g., 8).

Step 43: Compare the first down-converted signal with the second down-converted signal to generate at least one control signal.

Step 44: Adjust a peak gain of at least one equalizer according to the at least one control signal, wherein the peak gain of the at least one equalizer is at a Nyquist frequency.

In step 41, the control circuit 100 down converts the input signal Din to the first down-converted signal with the first conversion frequency ½Tb by co-operations of the oscillator 108, the first mixer 105, the first filter 111, the first rectifier 113, and the first direct amplifier 115. In Step 42, the control circuit 100 down converts the input signal Din to the second down-converted signal with the second conversion frequency by co-operations of the frequency divider 107, the second mixer 106, the second filter 112, the second rectifier 114, and the second direct amplifier 116. In step 43, the comparator 110 compares the first down-converted signal with the second down-converted signal to generate at least one control signal Ct1, CT2 or CT3. In step 44, the control circuit 100 adjusts the peak gain of at least one equalizer

101, 102 or 103 according to the at least one control signal CT1, CT2 or T3, wherein the peak gain of the at least one equalizer is at a Nyquist frequency.

To sum up, the equalizer system of the present invention extracts two signal components at the frequencies of ½ and a lower of the system frequency from the equalized input signals, by comparing the first and second signal components, the control circuit is able to adjust the peak gains of the first, second and third equalizers in order to keep the DC power difference at the predetermined magnitude and adapt to practical requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An equalizer system, comprising:

at least one equalizer configured to equalize an input signal to compensate estimated frequency dependent attenuation during transmission over a physical cable, to generate an equalized input signal;

a limiting amplifier coupled to the at least one equalizer, and configured to amplify the equalized input signal to a saturated level to generate an output signal; and a control circuit comprising an oscillator and frequency mixers coupled to the at least one equalizer and the limiting amplifier, and configured to generate at least one control signal to the at least one equalizer according to the equalized input signal to adjust a peak gain of the at least one equalizer, wherein the peak gain of the at least one equalizer is at a Nyquist frequency;

wherein the limiting amplifier amplifies the equalized input signal before the frequency mixers process the equalized input signal, and the Nyquist frequency is half of a sampling frequency.

2. The equalizer system of claim 1, wherein the at least one equalizer is an analog filter amplifier in which at least one of an operating frequency, a frequency bandwidth, a peak gain and a direct current level gain is adjustable.

3. The equalizer system of claim 1, wherein the control circuit comprises:

the oscillator configured to generate a first conversion frequency;

a first mixer of the frequency mixers coupled to the at least one equalizer and the oscillator, and configured to down-covert the equalized input signal with the first conversion frequency to generate a first down-converted signal;

a first filter coupled to the first mixer, and configured to filter the first down-converted signal within a first frequency range;

a first rectifier coupled to the first filter and the first direct amplifier, and configured to extract a power of the first down-converted signal and covert the power of the first down-converted signal to a first direct current level;

a first direct amplifier coupled to the first rectifier, and configured to amplify the first down-converted signal with a first direct current gain to generate a first amplified signal;

a frequency divider coupled to the oscillator, and configured to divide the first conversion frequency to generate a second conversion frequency;

a second mixer of the frequency mixers coupled to the at least one equalizer and the frequency divider, and configured to down-covert the equalized input signal with the second conversion frequency to generate a second down-converted signal;

a second filter coupled to the second mixer, and configured to filter the second down-converted signal within a second frequency range;

a second rectifier coupled to the second filter and the second direct amplifier, and configured to extract a power of the second down-converted signal and covert the power of the second down-converted signal to a second direct current level;

a second direct amplifier coupled to the second rectifier, and configured to amplify the second down-converted signal with a second direct current gain to generate a second amplified signal; and a comparator coupled to the first direct amplifier and the second direct amplifier, and configured to compare the first amplified signal with the second amplified signal to generate the at least one control signal.

4. The equalizer system of claim 3, wherein the first rectifier and the second rectifier are a RMS (root mean square) detector.

5. The equalizer system of claim 3, wherein the first filter and the second filter are a band pass filter, and the first and second frequency range is 100 MHz to 200 MHz.

6. The equalizer system of claim 3, wherein the frequency divider is configured to divide the first conversion frequency by N, wherein N is an integer from 16 to 64.

7. The equalizer system of claim 3, wherein the first conversion frequency is one half of a system frequency of the equalized input signal, and the second conversion frequency is the system frequency divided by N of the equalized input signal.

8. The equalizer system of claim 3, wherein when a direct current power difference between the first down-converted signal and the second down-converted signal is smaller or greater than a predetermined magnitude, the comparator generates the at least one control signal to adjust the peak gain of the at least one equalizer in order to keep the direct current power difference at the predetermined magnitude.

9. The equalizer system of claim 3, wherein the comparator comprises:

a negative input terminal coupled to the first direct amplifier, and configured to receive the first amplified signal;

a positive input terminal coupled to the second direct amplifier, and configured to receive the second amplified signal; and an output terminal coupled to the at least one equalizer;

wherein a feedback polarity after the first amplified signal has been compared with the second amplified signal is negative.

10. The equalizer system of claim 1, wherein the input signal, the equalized input signal and the output signal are linear NRZ (non-return to zero) random serial data signals.

11. A control method of adjusting a peak gain of an equalizer of an equalizer system, comprising:

down converting an input signal to a first down-converted signal with a first conversion frequency, wherein the first conversion frequency is half of a system frequency;

down converting the input signal to a second down-converted signal with a second conversion frequency, wherein the second conversion frequency is the system frequency divided by N;

comparing the first down-converted signal with the second down-converted signal to generate a control signal; and adjusting the peak gain of the equalizer according to the control signal, wherein the peak gain of the equalizer is at a Nyquist frequency.

12. The control method of claim 11, wherein the at least one equalizer is an analog filter amplifier in which at least one of an operating frequency, a frequency bandwidth, the peak gain and a direct current level gain is adjustable.

13. The control method of claim 11, wherein down converting the input signal to the first down-converted signal with the first conversion frequency comprises:

generating the first conversion frequency;

down-converting the equalized input signal with the first conversion frequency to generate a first down-converted signal;

filtering the first down-converted signal within a first frequency range;

extracting a power of the first down-converted signal and converting the power of the first down-converted signal to a first direct current level; and amplifying the first down-converted signal with a first direct current gain to generate a first amplified signal.

14. The control method of claim 13, wherein down converting the input signal to the second down-converted signal with the second conversion frequency comprises:

dividing the first conversion frequency to generate the second conversion frequency;

down-converting the equalized input signal with the second conversion frequency to generate the second down-converted signal;

filtering the second down-converted signal within a second frequency range;

extracting a power of the second down-converted signal and converting the power of the second down-converted signal to a second direct current level; and amplifying the second down-converted signal with a second direct current gain to generate a second amplified signal.

15. The control method of claim 14, wherein comparing the first down-converted signal with the second down-converted signal to generate the control signal comprises:

comparing the first amplified signal with the second amplified signal to generate the control signal.

16. The control method of claim 14, wherein the first conversion frequency is divided by 4.

17. The control method of claim 11 wherein the first conversion frequency is one half of a system frequency of the equalized input signal, and the second conversion frequency is the system frequency divided by N of the equalized input signal.

18. The control method of claim 11, wherein when a direct current power difference between the first down-converted signal and the second down-converted signal is smaller or greater than a predetermined magnitude, the control signal is generated to adjust the peak gain of the equalizer in order to keep the direct current power difference at the predetermined magnitude.

19. The control method of claim 11, wherein the input signal and the equalized input signal are linear NRZ (non-return to zero) random serial data signals.

* * * * *